US006995569B2

(12) United States Patent
Jecko et al.

(10) Patent No.: US 6,995,569 B2
(45) Date of Patent: Feb. 7, 2006

(54) DEVICE FOR ELECTROMAGNETIC CHARACTERISATION OF A TESTED STRUCTURE

(75) Inventors: Bernard Jean Yves Jecko, Rilhac Rancon (FR); Edson Antoine André Martinod, Vigeois (FR); Michèle Marie Lalande-Guionie, Brive (FR); Alain Jean Louis Reineix, Rilhac Rancon (FR)

(73) Assignee: Centre National de la Recherche Scientifique (C.N.R.S.), Paris (FR)

( * ) Notice: Subject to any disclaimer, the term of this patent is extended or adjusted under 35 U.S.C. 154(b) by 54 days.

(21) Appl. No.: 10/433,501

(22) PCT Filed: Nov. 28, 2001

(86) PCT No.: PCT/FR01/03767

§ 371 (c)(1),
(2), (4) Date: Nov. 20, 2003

(87) PCT Pub. No.: WO02/46780

PCT Pub. Date: Jun. 13, 2002

(65) Prior Publication Data

US 2004/0075441 A1    Apr. 22, 2004

(30) Foreign Application Priority Data

Dec. 4, 2000   (FR)  .................................. 00 15700

(51) Int. Cl.
*G01R 31/04*    (2006.01)
*G01R 27/04*    (2006.01)

(52) U.S. Cl. ...................... 324/538; 324/639; 324/642
(58) Field of Classification Search ................ 324/538, 324/637–639, 642, 645–648
See application file for complete search history.

(56) References Cited

U.S. PATENT DOCUMENTS 5,059,915 A * 10/1991 Grace et al. ................. 324/638
5,119,035 A *  6/1992 Goy et al. ................... 324/637

FOREIGN PATENT DOCUMENTS

| EP | 0 736 776 | 10/1996 |
| EP | 0 810 445 | 12/1997 |
| EP | 0 822 671 | 2/1998 |
| FR | 2 751 415 | 1/1998 |

OTHER PUBLICATIONS

A. Schutte et al., "Comparison of Time Domain and Frequency Domain Electromagnetic Susceptibility Testing", Record of the International Symposium on Electromagnetic Compatibility (EMC), Chicago, Aug. 22-26, 1994, New York, pp. 64-67, XP000503290.

* cited by examiner

*Primary Examiner*—Anjan Deb
*Assistant Examiner*—Timothy J. Dole
(74) *Attorney, Agent, or Firm*—Young & Thompson

(57) ABSTRACT

A device for electromagnetic characterization of a tested structure elevates, on a predetermined frequency band, distribution parameters of the structure and parameters characteristic of the spurious rays of the structure. The device includes an electric signal generator and an analyzer for analyzing the signal transmitted by the generator and signals reflected by the structure and signals transmitted by the structure. In addition, the electric signal generator is a pulsed signal generator whereof the spectrum is at least as broad as the predetermined frequency band, and the analyzer includes a filter for temporal filtering of the signals it receives, to eliminate spurious signals.

13 Claims, 6 Drawing Sheets

DEVICE FOR ELECTROMAGNETIC CHARACTERISATION OF A TESTED STRUCTURE

The present invention relates to a device for electromagnetic characterization of a tested structure, and to a corresponding process.

More precisely, the invention relates to a device for electromagnetic characterization of a tested structure terminated by connectors linked to transmission lines of any impedance, by evaluating, on a predetermined frequency band, distribution parameters of this structure and characteristic parameters of the spurious radiations of this structure. This device comprises an electrical signal generator, means of transmitting this electrical signal to the tested structure, means of analysis of the signal emitted by the generator, as well as of the signals reflected by the structure and of the signals transmitted by the structure, the means of analysis comprising means of calculation of the distribution parameters of the tested structure and of the characteristic parameters of the spurious radiations.

Conventionally, such a device, used for example for the electromagnetic characterization of an electrical connector, generally comprises a network analyzer connected to the two terminals of the electrical connector.

The network analyzer comprises a sinusoidal signal generator whose frequency can be adjusted within the predetermined frequency band. It transmits this signal to either of the two terminals of the connector and receives in return a signal reflected by this terminal and a signal transmitted by the other terminal.

However, the network analyzer also receives spurious signals at the same frequency, stemming in particular from electromagnetic waves emanating from a radiation of the characterization device and of the tested structure and backscattered by the walls of premises in which the electromagnetic characterization device is placed.

The frequency of the spurious signals being the same as that of the signals to be analyzed, the network analyzer cannot differentiate between these signals. To obtain accurate measurements, it is therefore necessary to place the electromagnetic characterization device and the tested structure in an anechoic chamber, which absorbs the electromagnetic waves radiated.

Moreover, to characterize the tested structure over the entire predetermined frequency band, the signal generator of the network analyzer must provide a multiplicity of successive sinusoidal signals scanning said frequency band.

The invention aims to remedy these drawbacks by creating a device capable of accurately performing the electromagnetic characterization measurements, while being simple and inexpensive.

The subject of the invention is therefore a device for electromagnetic characterization of a tested structure terminated by connectors linked to transmission lines of any impedance, by evaluating, on a predetermined frequency band, distribution parameters of this structure and characteristic parameters of the spurious radiations of this structure, comprising an electrical signal generator, means of transmitting this electrical signal to the tested structure, means of analysis of the signal emitted by the generator, as well as of the signals reflected by the structure and of the signals transmitted by the structure, the means of analysis comprising means of calculation of the distribution parameters and of the characteristic parameters of the spurious radiations of the tested structure, characterized in that the electrical signal generator is a generator of a pulsed signal whose spectrum is at least as wide as said predetermined frequency band, the generator being adapted for emitting this pulsed signal at least once, and in that the means of analysis comprise means of temporal filtering of the signals which they receive, for the elimination of spurious signals.

Thus, the electromagnetic characterization device according to the invention makes it possible to characterize the tested structure, over the entire predetermined frequency band, by generating a singles pulsed signal whose spectrum covers this frequency band, it being possible for this pulsed signal to be emitted one or more times by the generator.

Moreover, the signals received in return by the means of analysis of the electromagnetic characterization device are also pulsed signals, be they signals reflected and transmitted by the tested structure or spurious signals.

Thus, the means of analysis furthermore comprising means of temporal filtering of these signals, it is easy for them to eliminate the spurious signals, without requiring the device to be placed in an anechoic chamber.

The electromagnetic characterization device according to the invention can furthermore comprise one or more of the following characterictics:
- the tested structure being terminated by multiwire connectors, the device furthermore comprises propagation mode and impedance matching means disposed between these multiwire connectors and the remainder of the device;
- the tested structure being terminated by connectors each linked to at least one two-wire line, the matching means comprise a plurality of adapters of each two-wire line, disposed on either side of the tested structure, each comprising a voltage splitting circuit and a two-wire connection terminal formed by the two central conductors of two coaxial cables whose outer conductors are short-circuited;
- the device furthermore comprises means of transmission of the pulsed signal alone, to the means of analysis for the provision of a reference signal to them;
- the width of the predetermined frequency band is greater than or equal to 1 GHz;
- the pulsed signal is a pulsed signal of Gaussian general shape;
- the means of analysis comprise a first path for processing the signal emitted by the generator and the signal reflected by the tested structure, comprising at least one reception path, and a second path for processing the signal transmitted by the tested structure comprising at least one reception path;
- the temporal filtering means comprise first means of selection between predetermined instants of a part of the signals received by the first processing path, this part containing only the signal reflected by the tested structure, and second means of selection between predetermined instants of a part of the signals received by the second processing path, this part containing only the signal transmitted by the tested structure;
- means of prolongation by continuity of said part containing only the signal transmitted by the tested structure, for the reconstruction of this transmitted signal, are associated with said second means of selection;
- the tested structure is a connector of multiwire links;
- the means of calculation comprise means of calculation of the amount of power radiated by the tested structure; and
- the tested structure being a connector of multiwire links, the means of calculation comprise means of calculation of the field radiated by this connector, when the latter is used in the implementation of a link between an emitter and a receiver of electrical signals.

The subject of the invention is also a process for electromagnetic characterization of a tested structure terminated by connectors linked to transmission lines of any impedance, by evaluating, on a predetermined frequency band, distribution parameters of this structure and characteristic parameters of the spurious radiations of this structure, the process comprising the following steps:

the emission, at least once, by a generator of an electrical signal toward the tested structure;

the reception of the signal emitted by the generator as well as of the signals reflected by the structure and of the signals transmitted by the structure, by means of analysis; and the calculation by the means of analysis of the distribution parameters of the tested structure and of the characteristic parameters of the spurious radiations of this structure, characterized in that the electrical signal is a pulsed signal of greater spectral width than said predetermined frequency band, and in that the process furthermore comprises a step of temporal filtering of the signals received by the means of analysis, for the elimination of spurious signals.

The invention will be better understood on reading the following description, given merely by way of example and while referring to the appended drawings, in which.

Figure 1:
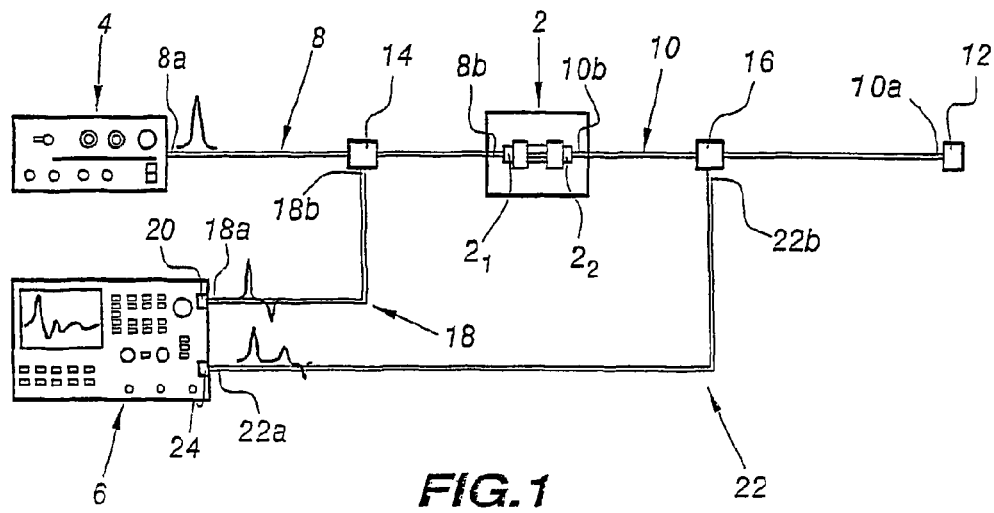
FIG. 1 is a diagrammatic view of the general structure of a device according to a first embodiment of the invention.
Figure 3:
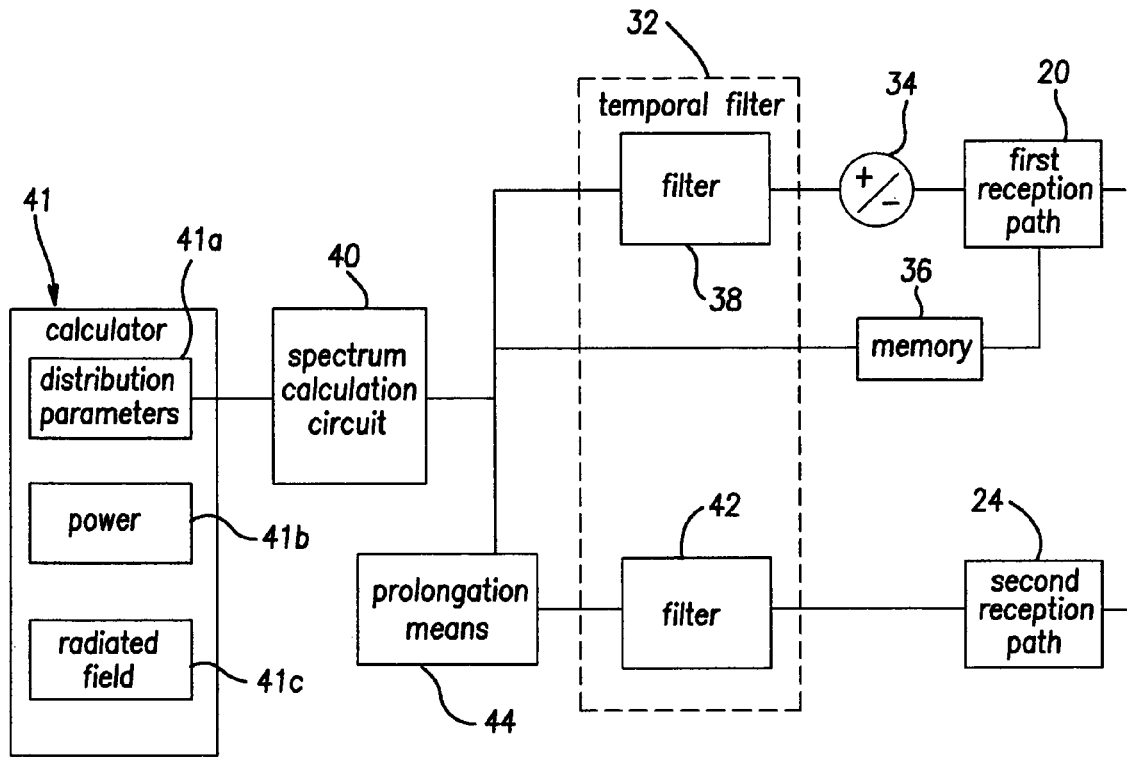
Figure 4:
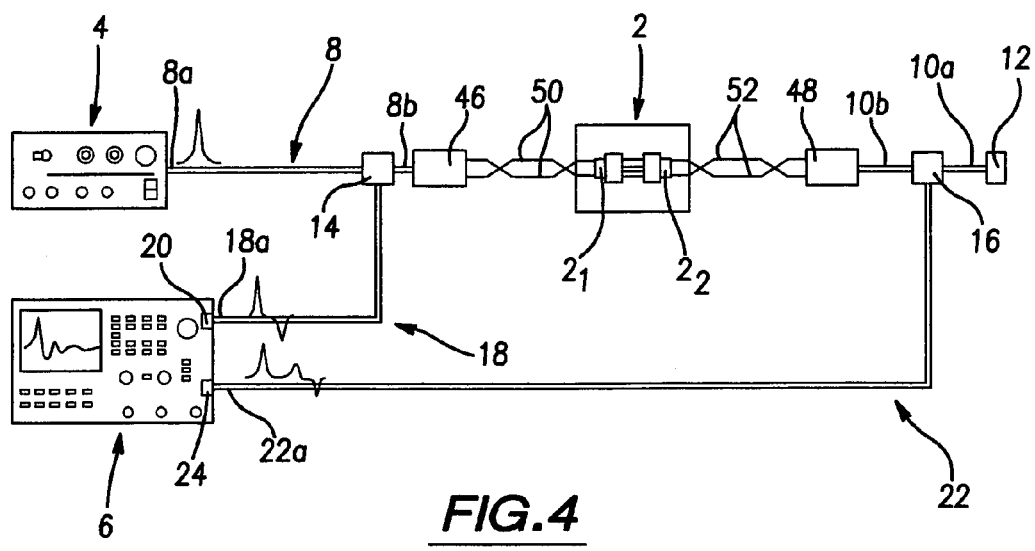
Figure 5:
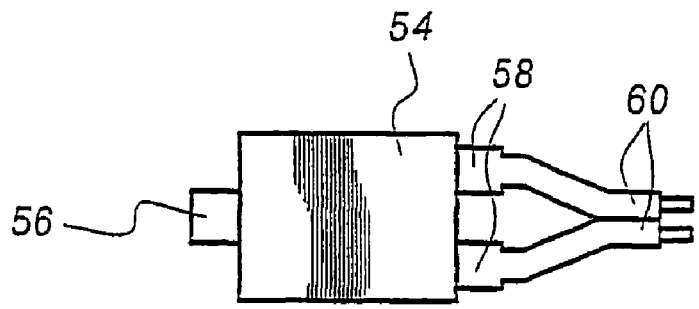
Figure 6:
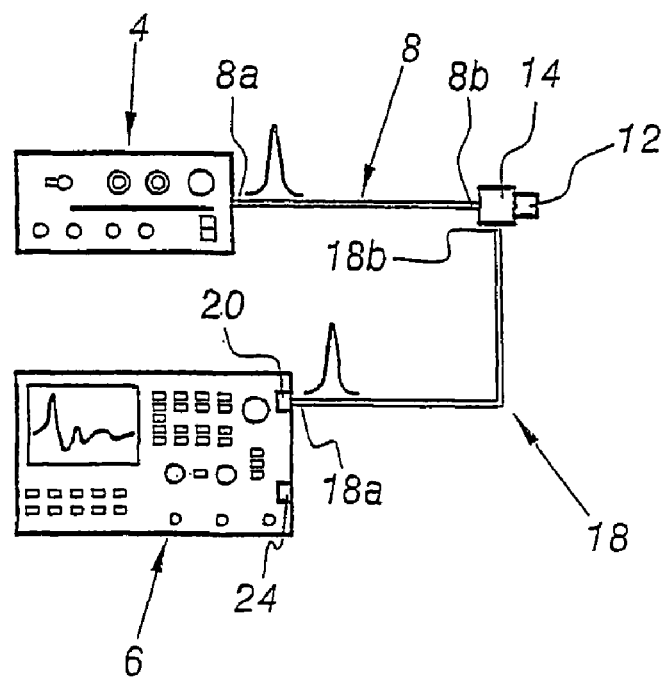
Figure 8A:
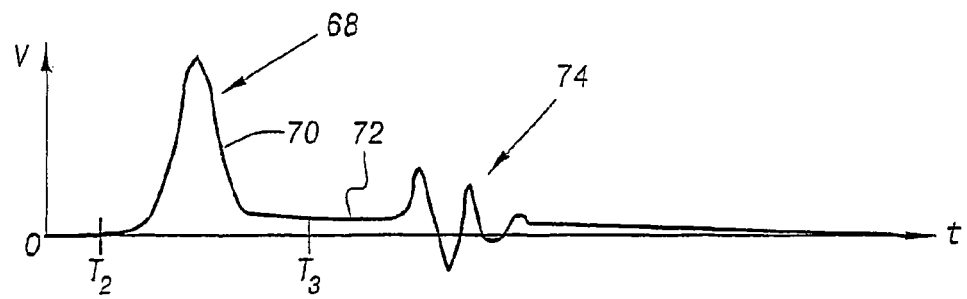
Figure 8B:
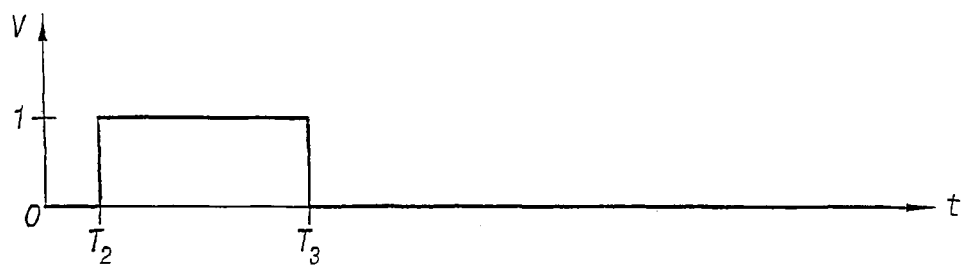
Figure 8C:
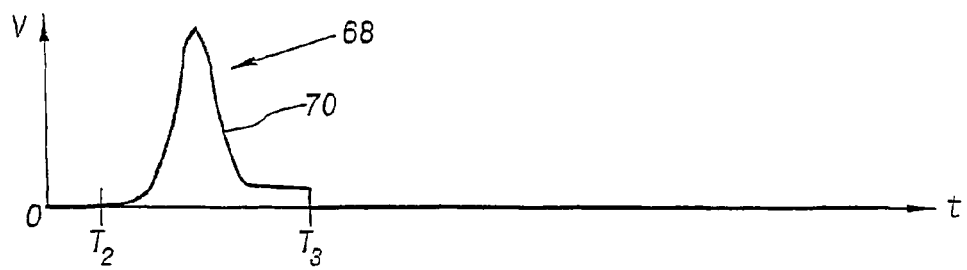
Figure 8D:
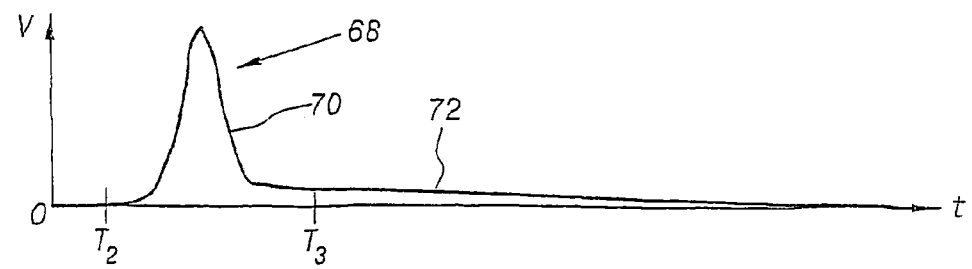
Figure 9:
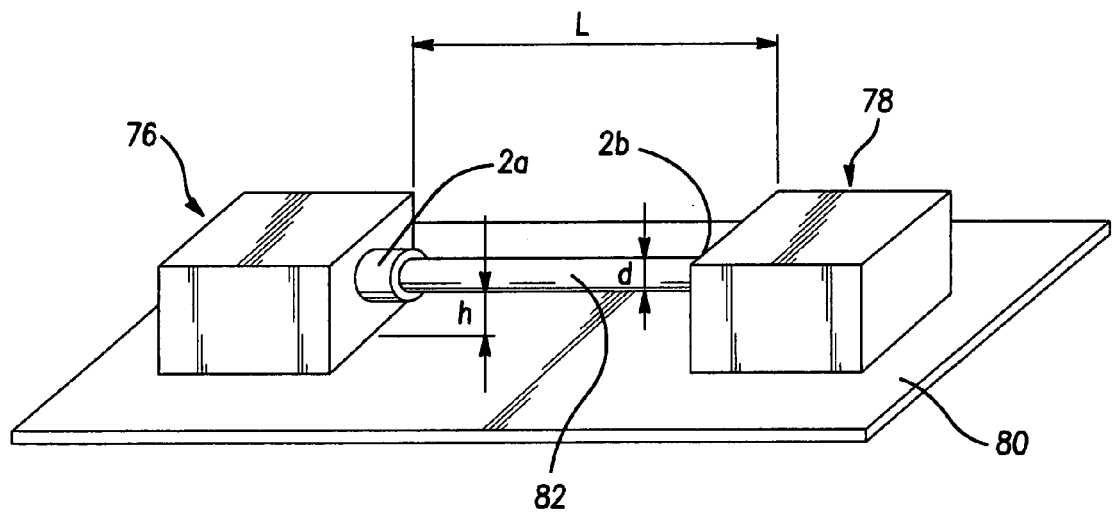

FIG. 3 diagrammatically represents the structure of means of analysis of the device of FIG. 1;

FIG. 4 is a diagrammatic view of the general structure of a device according to a second embodiment of the invention;

FIG. 5 is a diagrammatic view of means of matching the device of FIG. 4;

FIG. 6 is a diagrammatic view of the general structure of a device for providing a reference signal to the means of analysis of FIG. 3;

FIGS. 7A to 7D represent the profile of a signal received and processed by a first processing path of the means of analysis of FIG. 3;

FIGS. 8A to 8D represent the profile of a signal received and processed by a second processing path of the means of analysis of FIG. 3; and FIG. 9 is a diagrammatic view of a link between an emitter and a receiver, using connectors tested by the device of FIG. 1.

The electromagnetic characterization device represented in FIG. 1 comprises a tested structure 2 consisting of a connector of coaxial cables of 50 ohm impedance, a pulse generator 4 and means of analysis 6.

A first coaxial transmission cable 8 is disposed between the pulse generator 4 and the connector 2. It comprises an end 8a connected at the output of the pulse generator 4 and another end 8b connected to a first terminal $2_1$ of the connector 2.

A second coaxial transmission cable 10 is disposed between the connector 2 and a load 12. An end 10a of this second cable 10 is connected to the load 12, while the other end 10b of the second cable 10 is connected to a second terminal $2_2$ of the connector 2.

A probe 14 is disposed on the first transmission cable 8, so as to gather a signal emitted by the pulse generator 4 and a signal reflected by the connector 2.

A probe 16 is disposed on the second transmission cable 10, so as to gather a signal transmitted by the connector 2.

A third transmission cable 18 is disposed between the means of analysis 6 and the probe 14. A first end 18a of this third cable 18 is connected to a first reception path 20 of the means of analysis 6, while its other end 18b is connected to the probe 14.

A fourth transmission cable 22 is disposed between the means of analysis 6 and the probe 16. A first end 22a of this fourth transmission cable 22 is connected to a second reception path 24 of the means of analysis 6, while its other end 22b is connected to the probe 16.

The device as described above is mounted as a forward setup.

It allows the first reception path 20 to receive the signal emitted by the pulse generator 4 and the signal reflected by the connector 2 at the level of its first terminal $2_1$. It furthermore allows the second reception path 24 to receive the signal transmitted by the connector 2 at the level of its second terminal $2_2$.

It is however possible to swap the pulse generator 4 and the load 12, so that the load 12 is connected to the end 8a of the first transmission cable 8 and that the pulse generator 4 is connected to the end 10a of the second transmission cable 10. In this case, the device is mounted as a reverse setup.

The reverse-mounted device allows the second reception path 24 to receive the signal emitted by the pulse generator 4 and the signal reflected by the connector 2 at the level of its second terminal $2_2$. It furthermore allows the first reception path 20 to receive the signal transmitted by the connector 2 at the level of its first terminal $2_1$.

The pulse generator 4 used is for example the generator known by the reference PSPL2600C and marketed by the company PICOSECOND PULSE LABS. This generator exhibits an output impedance of 50 ohms.

Figure 2:
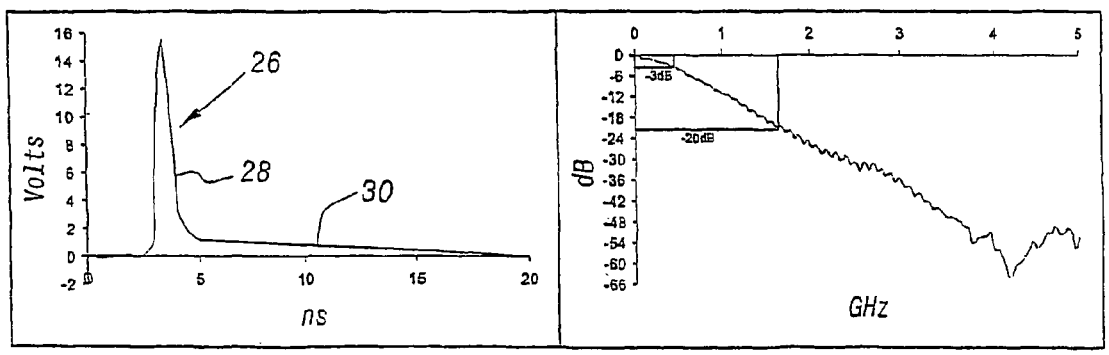
FIG. 2 represents the time profile and the spectrum of a pulse provided by a generator of the device of FIG. 1.

As is represented in FIG. 2, this pulse generator 4 provides a pulsed signal 26 exhibiting a first part 28 of Gaussian shape of short duration, followed by a second linear part 30 of small amplitude, but tending more slowly to 0.

It will be noted that the bandwidth of this pulsed signal 26 at −20 dB is greater than 1.5 GHz.

The probes 14 and 16 used are preferably of the PSPL 5520C type marketed by the company PICOSECOND PULSE LABS. They exhibit an impedance of 50 ohms and a bandwidth of greater than 3 GHz.

The transmission cables 8, 10, 18 and 22 used are of the conventional type. They exhibit an impedance of 50 ohms and allow the propagation of the pulsed signal delivered by the generator 4 as well as of the pulsed signal reflected and of the pulsed signal transmitted by the connector 2, without deforming their temporal shape and, consequently, without altering their spectral content.

The means of analysis 6 comprise for example a direct-sampling oscilloscope, such as the TDS 694C oscilloscope marketed by the company TEKTRONIKS. This oscilloscope allows once-only acquisition of a signal, for a limited number of samples and a limited vertical resolution.

However, the means of analysis 6 preferably comprise a sequential-sampling oscilloscope, such as the TDS 820 oscilloscope marketed by the company TEKTRONIKS.

The use of such an oscilloscope requires that the pulse generator 4 emit a plurality of identical pulsed signals at regular intervals.

The digital oscilloscope 6 then periodically taps off samples, according to a period slightly greater than the emission period of the pulsed signals. This samples tapping period is adjusted as a function of the total number of samples to be tapped off and the number of pulsed signals to be emitted by the generator is equal to the number of samples to be tapped off in the course of a measurement.

On the other hand, this oscilloscope allows the acquisition of a signal, with a number of samples and a vertical resolution which are markedly greater than those allowed by a direct-sampling oscilloscope.

The means of analysis 6 also comprise, for example, a microcomputer linked to the oscilloscope, to perform a part of the processing and calculations allowing the determination of the distribution parameters of the connector 2 and of the characteristic parameters of the spurious radiations of this connector, such as, in particular the power and the field radiated by the connector 2.

With reference to FIG. 3, the first and second reception paths 20 and 24 of the means of analysis 6 of the forward-mounted device with electromagnetic characteristics receive electrical signals picked up by the probes 14 and 16. They output digital signals obtained by sampling these electrical signals.

The signal provided by the first reception path 20, which contains the signal 26 emitted by the pulse generator 4, the signal reflected by the connector 2 and spurious signals, is transmitted to an input of a subtractor 34. A second input of the subtractor 34 is connected to a RAM type memory 36, furthermore connected to the first input 20. In this memory 26 are stored data relating to the signal 26 emitted by the pulse generator 4.

These data are recorded during a step of provision of a reference signal, which will be described later.

The subtractor 34 outputs a signal to a filter 38 of the means 32 of temporal filtering. This filter performs a temporal selection of a part of said signal, between two predetermined instants T0 and T1.

The first reception path 20, the subtractor 34 and the filter 38 constitute a first processing path of the analysis means 6.

The processing of the signal originating from the first reception path 20, by this first processing path will be described with reference to FIGS. 7A to 7D. At the end of processing, it makes it possible to obtain just the signal reflected by the connector 2.

The signal output by the filter 38 is then transmitted by the temporal filtering means 32 to a spectrum calculation circuit 40.

The spectrum calculation circuit 40 is furthermore connected to the memory 36, thus allowing it to also receive as input the signal 26 emitted by the pulse generator 4.

The circuit 40 is adapted for calculating the spectrum of a signal provided as input.

In the filtering means 32, the sampled signal provided by the second input 24 of the analysis means 6, which comprises the signal transmitted by the connector 2 and the spurious signals, is transmitted to a filter 42 of the temporal filtering means 32, performing a temporal selection of a part of this signal between two predetermined instants T2 and T3.

The signal output by the filter 42 is transmitted by the temporal filtering means 32 to means 44 of prolongation by continuity of this signal.

The second reception path 24, the filter 42 and the means 44 of prolongation by continuity constitute a second processing path of the analysis means 6.

The processing of the signal originating from the second reception path 24, by this second processing path, will be described with reference to FIGS. 8A to 8D. At the end of processing, it makes it possible to obtain just the signal transmitted by the connector 2.

The signal output by the means 44 of prolongation by continuity is transmitted to the spectrum calculation circuit 40.

The spectrum calculation circuit 40 is connected at output to a calculator 41 which it provides with the spectral coefficients of the signal 26 emitted by the pulse generator 4, of the signal reflected by the connector 2 and of the signal transmitted by this same connector 2, after having performed the calculation of their spectrum.

The calculator 41 is adapted for providing the distribution parameters of the connector 2 as well as the characteristic parameters of the spurious radiations of this connector, on the basis of the spectral coefficients.

It comprises means 41a of calculation of the distribution parameters of the connector 2, means 41b of calculation of the power radiated by the connector 2 and means 41c of calculation of the field radiated by the connector 2. Its manner of operation will be detailed subsequently.

The analysis means 6 represented in FIG. 3 have been described in accordance with the device represented in FIG. 1, that is to say as a forward setup.

When the electromagnetic characterization device is mounted as a reverse setup, the first reception path 20 should be linked to the filter 42 and the second reception path 24 to the subtractor 34 and to the RAM memory 36.

Thus, the analysis means 6 are adapted so that the first processing path is constituted by the second reception path 24, the subtractor 36 and the filter 38, and so that the second processing path is constituted by the first reception path 20, the filter 42 and the means 44 of prolongation by continuity. This adaptation is automatic and performed by software means.

The electromagnetic characterization device represented in FIG. 4 relates to another possible embodiment of the invention. It comprises, this time, a tested structure 2 consisting of a connector of multiwire links, whose impedance is different from 50 ohms. In the description of FIG. 4, we shall limit ourselves to the case of a connector of two-wire links of 100-ohm impedance.

In this embodiment, in which the device is mounted as a forward setup, the pulse generator 4, the means of analysis 6, the load 12, the probes 14 and 16, the third and fourth transmission cables 18 and 22, are identical to those described with reference to FIG. 1 and are disposed in the same manner.

By contrast, the connector 2 being a connector of two-wire links, the first and second transmission cables 8, 10 cannot be linked directly to the terminals $2_1$ and $2_2$ of this connector.

Thus, the first transmission cable 8 is connected on the one hand, by its end 8a to the pulse generator 4, and on the other hand by its end 8b to a first adapter 46. The second transmission cable 10 is, for its part, connected on the one hand, to the load 12 by its end 10a and on the other hand to a second adapter 48 by its end 10b.

The first adapter 46 is furthermore connected to the terminal $2_1$ of the two-wire connector 2 by means of a two-wire link 50 and the second adapter 48 is furthermore connected to the terminal $2_2$ of the two-wire connector 2 by means of a two-wire link 52.

The first and second adapters 46 and 48 have to carry out adaptation between a coaxial mode of propagation of a signal in the cables 8 and 10 and a differential mode of propagation in the two-wire links 50 and 52.

Moreover, since the connector 2 exhibits an impedance of 100 ohms, while the generator 4, the analysis means 6, the cables 8, 10, 18 and 22, the probes 14 and 16 each have an impedance of 50 ohms, the adapters 46 and 48 must furthermore carry out impedance matching from 50 to 100 ohms.

Finally, the adapters 46 and 48 must be bidirectional.

These two adapters being identical, one of them, for example the adapter 46, is represented in FIG. 5. It comprises, for example, a voltage splitting circuit 54.

This circuit 54 comprises a coaxial input terminal 56, for receiving the end 8b of the first transmission cable 8, and two coaxial output terminals 58, to which are connected two semi-rigid coaxial cables 60.

The outer conductors of the two coaxial cables 60 are soldered at their opposite end to the output terminals 58 so as to short-circuit them and thus carry out the impedance matching. The central core of each of these two coaxial cables 60 is adapted for receiving one of the two wires of the two-wire link 50 or 52.

The device described with reference to FIGS. 4 and 5 may be adapted simply to allow the characterization of a structure terminated by connectors of multiwire links with 2n wires, n being any integer number.

Specifically, in this case, a multiwire link may be regarded as n two-wire links. Each of these n two-wire links is then connected to an adapter such as that described with reference to FIG. 5.

The electromagnetic characterization device then comprises n adapters such as the adapter 46, n adapters such as the adapter 48, n cables such as the cable 8, n cables such as the cable 10, n cables such as the cable 18, n cables such as the cable 22, n probes such as the probe 14, n probes such as the probe 16 and n loads such as the load 12.

It is then necessary to provide means of analysis 6 comprising n reception paths such as the reception path 20 and n reception paths such as the reception path 24.

The device for providing a reference signal to the analysis means 6 and which is represented in FIG. 6 comprises the pulse generator 4 connected to the end 8a of the first transmission cable 8. The end 8b of the first transmission cable is connected to the load 12.

The probe 14 is disposed on the first transmission cable 8 at the level of its end 8b and is connected to the end 18b of the third transmission cable 18.

The end 18a of this third transmission cable 18 is connected to the first reception path 20 of the analysis means 6.

The manner of operation of the means of analysis 6 of the device represented in FIG. 1, of the device represented in FIG. 4 or of the device represented in FIG. 6, will now be described.

The means of analysis 6 perform the calculation of four distribution parameters $S_{11}$, $S_{21}$, $S_{12}$ and $S_{22}$ of the tested structure 2. The coefficients $S_{11}$ and $S_{21}$ respectively represent the reflection coefficient and the transmission coefficient of the tested structure 2, when the device is mounted as a forward setup. The coefficients $S_{22}$ and $S_{12}$ respectively represent the reflection coefficient and the transmission coefficient of the tested structure 2, when the device is mounted as a reverse setup.

Additionally, the means of analysis perform the calculation of the amount η of power lost by the connector 2 and the field $\vec{E}$ radiated by this connector 2, which are deduced from the distribution parameters $S_{11}$, $S_{21}$, $S_{12}$ and $S_{22}$.

Firstly, during a step of provision of a reference signal to the analysis means 6, implemented in the calibration device represented in FIG. 6, the first reception path 20 of the analysis means 6 receives the pulsed signal 26 emitted by the pulse generator 4 and picked up by the probe 14. After having been sampled by the first reception path 20 of the analysis means 6, this pulsed signal is stored in the RAM memory 36.

Figure 7A:
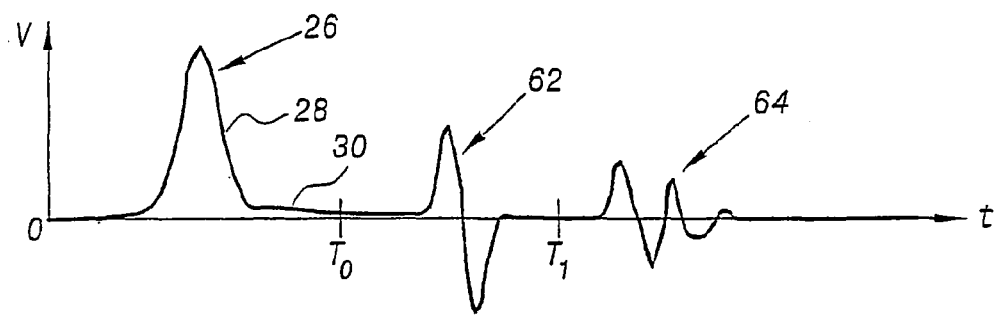

For the calculation of the reflection coefficients $S_{11}$ and $S_{22}$, depending on whether the device is mounted as a forward or reverse setup, the analysis means 6 receive as input from the subtractor 34, a signal, such as that represented in FIG. 7A.

This signal comprises the pulsed signal 26 emitted by the pulse generator 4 whose first part 28 of Gaussian shape is received by the analysis means 6, before a predetermined instant T0. This signal furthermore comprises the pulsed signal 62 reflected by the connector 2, received by the analysis means 6 between the instant T0 and a predetermined instant T1.

Finally, this signal comprises spurious echoes 64, received by the analysis means 6 beyond the instant T1.

Figure 7B:
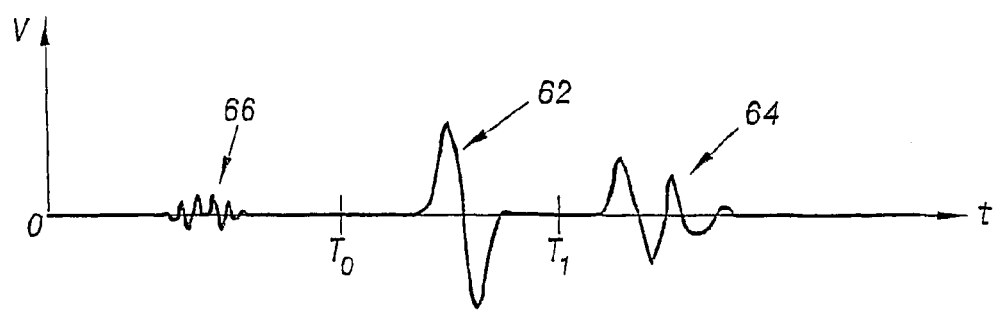

With reference to FIG. 7B, the signal provided by the subtractor 34 to the filter 38, after subtraction of the pulsed signal 26 stored in the RAM memory 36, comprises a residual signal 66 of the Gaussian part of the pulsed signal 26. This residual signal 66 is received by the analysis means 6 before the instant T0. Between the instants T0 and T1, the signal comprises just the reflected pulsed signal 62 from which has been subtracted the second, linear, part 30 of the pulsed signal 26. Beyond the instant T1, this signal comprises the spurious echoes 64.

Figure 7C:
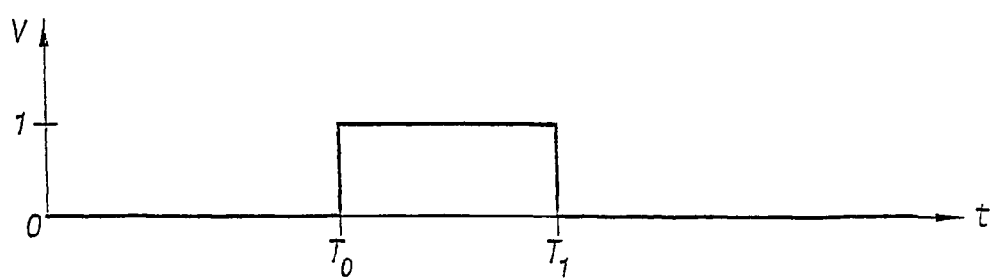

This signal is thereafter modulated in the filter 38 by a time function represented in FIG. 7C. This modulating function is a gating function taking the value 1 between the instants T0 and T1 and zero everywhere else.

Figure 7D:
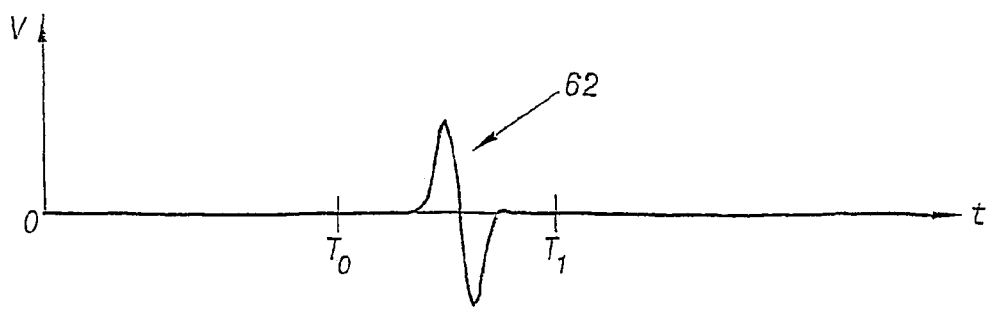

Consequently, as represented in FIG. 7D, the signal provided to the circuit 40 by the analysis means 6, now comprises only the reflected signal 62.

For the calculation of the transmission coefficients $S_{21}$ and $S_{12}$, the temporal filtering means 32 receive as input from the filter 42, a signal, as represented in FIG. 8A. This signal comprises the pulsed signal 68 transmitted by the connector 2, exhibiting a first part 70 of Gaussian shape received by the analysis means 6 between predetermined instants T2 and T3, and a second, linear, part 72 extending beyond the instant T3. This signal furthermore comprises spurious signals 74 received by the analysis means 6 beyond the instant T3, but superimposed on the second part 72 of the transmitted signal 68.

In the filter 42, the signal represented in FIG. 8A is modulated by a function, as represented in FIG. 8B.

This modulating function is a gating function equal to 1 between the instants T2 to T3 and zero everywhere else.

Thus, as represented in FIG. 8C, the signal provided to the means 44 of prolongation by continuity is a signal ridded of the spurious signals 74, but exhibiting a discontinuity at the instant T3.

As represented in FIG. 8D, the means 44 of prolongation by continuity perform a linear prolongation by continuity of the signal represented in FIG. 8C. Specifically, this truncated signal is supplemented with a linear part, the slope of which is equal to the slope of the truncated signal in the neighborhood of the instant T3.

Thus, the signal represented in FIG. 8D, provided to the circuit 40 by the analysis means 6, now comprises only the signal transmitted 68 by the connector 2.

The calculation of the spectral coefficients of the pulse 26 emitted by the pulse generator 4, of the pulse reflected by the connector 2 and of the pulse transmitted by this same connector 2, is then performed by the spectrum calculation circuit 40. This calculation is regarded as conventional and will therefore not be detailed.

The calculation of the parameters $S_{11}$, $S_{21}$, $S_{12}$ and $S_{22}$ by the means of calculation 41a of the calculator 41 requires the implementation of a prior calibration process, so as to compensate for systematic errors dependent on the structure of the electromagnetic characterization device, as represented in FIG. 1 or in FIG. 4.

This calibration process, as well as the calculation of the distribution parameters by the calculation means 41a, are also regarded as conventional and will not be described.

For example, for the device represented in FIG. 1, the calibration process generally used is a conventional calibration process of SOLT (Short Open Load Thru) type.

The calibration process implemented for the device represented in FIG. 4 is a calibration process of TRL (Thru, Reflect, Line) type. Such a process for this calibration, as well as a process for calculating the distribution parameters for the device represented in FIG. 4, is described in the article entitled "Improving TRL calibrations of vector network analyzers", by Don Metzger, published in Microwave Journal, May 1995, pages 56 to 68.

Thereafter, the calculation means 41b perform the calculation of the amount η of power radiated by the connector 2. This amount is given by the following formula (in a forward setup):

$$\eta = 1 - |S_{11}|^2 - |S_{21}|^2.$$

The calculation means 41c perform the calculation of the field $\vec{E}$ radiated by the connector 2, when the latter is used in the implementation of a link between an emitter and a receiver, as represented in FIG. 9. The setup represented in this figure comprises a transmission line 82 of any impedance, of length L and of diameter d, connected on the one hand to an emitter 76 by means of a connector 2a, like the connector 2, and is connected to a receiver 78 by means of another connector 2b like the connector 2.

This transmission line 82 is furthermore disposed at a height h, with respect to a ground plane 80 of the setup.

The connectors 2a and 2b may be likened to generators of common-mode currents $I_{c1}$ and $I_{c2}$.

The common-mode current $I_{c1}$ of the connector 2a near the emitter 76, is given by the following formula:

$$I_{c1} = \sqrt{\frac{2\eta}{z_c}}, \text{ where } z_c = 60 \ln\left(\frac{4h}{d}\right)$$

is the characteristic impedance of the transmission line 82.

The common-mode current $I_{c2}$ of the connector 2b near the receiver 78, is given by the following formula:

$$I_{c2} = (1-\sqrt{\eta})I_{c1}e^{-j\beta L}$$

where $$\beta = \frac{2\pi f}{\lambda},$$

with f and λ being the frequency and the wavelength of a current passing through the transmission line 82.

The far field $\vec{E}_1$ radiated by the setup and due to the presence of the connector 2a, is then estimated in polar coordinates, taking the setup as origin, by the following relation:

$$\overrightarrow{E_1(r,\theta)} = j\frac{k}{4\pi}z_o\psi(r)\sin\theta\frac{\sin X_1}{X_1}I_{c1}L.2\sin Y \vec{U}_\theta \text{ with}$$

$$X_1 = \frac{kL}{2}(\cos\theta - 1) \text{ and}$$

$$Y = \frac{2\pi h}{\lambda}\sin\theta \text{ where}$$

$$Z_o = 120\pi, \ \psi(r) = \frac{e^{-jkr}}{r}, k = \frac{2\pi f}{c}.$$

The far field $\vec{E}_2$ radiated by the setup and due to the presence of the connector 2b is estimated by the following relation:

$$\overrightarrow{E_1(r,\theta)} = j\frac{k}{4\pi}z_o\psi(r)\sin\theta\frac{\sin X_2}{X_2}I_{c2}L.2\sin Y (-\vec{U}_\theta) \text{ with}$$

$$X_2 = \frac{kL}{2}(\cos\theta + 1) \text{ and}$$

$$Y = \frac{2\pi h}{\lambda}\sin\theta \text{ where}$$

$$Z_o = 120\pi, \ \psi(r) = \frac{e^{-jkr}}{r}, k = \frac{2\pi f}{c}$$

Thus, the total radiated field becomes:

$$\overrightarrow{E(r,\theta)} = j\frac{k}{4\pi}z_o\psi(r)\sin\theta\frac{\sin X_1}{X_1}I_{c1}L.2\sin Y \, U_\theta +$$
$$j\frac{k}{4\pi}z_o\psi(r)\sin\theta\frac{\sin X_2}{X_2}(1-\sqrt{\eta})I_{c1}e^{-j\beta L}L.2\sin Y(-\vec{U}_\theta)$$

From this, one deduces the value of the modulus of the total field radiated by the setup in the presence of the connectors 2a and 2b, given by the following relation:

$$|rE(r,\theta)| = \left|\frac{60\pi}{c}fLI_{c1}\sin\theta 2\sin Y\right| \times$$
$$\sqrt{\left(\left(\frac{\sin X_1}{X_1} - \frac{\sin X_2}{X_1}\right)(1-\sqrt{\eta})\cos\beta L\right)^2 + \left(\left(\frac{\sin X_2}{X_2}\right)(1-\sqrt{\eta})\sin\beta L\right)^2}$$

It is clearly apparent that an electromagnetic characterization device according to the invention makes it possible to characterize the tested structure 2 over the entire predetermined frequency band, with the aid of the pulse 26 emitted by the pulse generator 4.

Specifically, the analysis means 6 possess means 32 of temporal filtering allowing discrimination of the pulse emitted by the pulse generator 4, of the pulse reflected by the connector 2, of the pulse transmitted by this same connector 2, and the rejection of spurious signals.

Moreover, they comprise means of calculation of the dispersion parameters of the connector 2, of the amount of power radiated by the connector 2 and of the field radiated by this connector 2.

What is claimed is:

1. A device for electromagnetic characterization of a tested structure (2) terminated by connectors linked to transmission lines of any impedance, by evaluating, on a predetermined frequency band, distribution parameters of this structure (2) and characteristic parameters of the spurious radiations of this structure (2), comprising:
- an electrical signal generator (4),
- means (8) of transmitting this electrical signal to the tested structure (2),
- means (6) of analysis of the signal emitted by the generator (4), as well as of the signals reflected by the structure (2) and of the signals transmitted by the structure (2),
- the means of analysis (6) comprising means (41) of calculation of the distribution parameters and of the characteristic parameters of the spurious radiations of the tested structure, wherein the electrical signal generator (4) is a generator of a pulsed signal (26) whose spectrum is at least as wide as said predetermined frequency band, the generator being adapted for emitting this pulsed signal (26) at least once,
- and wherein the means of analysis (6) comprise means (32) of temporal filtering of the signals which they receive, for the elimination of spurious signals (64, 74).

2. The device for electromagnetic characterization as claimed in claim 1, wherein the tested structure (2) is terminated by multiwire connectors, and
- the device furthermore comprises propagation mode and impedance matching means (46, 48) disposed between these multiwire connectors and the remainder of the device.

3. The device for electromagnetic characterization as claimed in claim 2, wherein, the tested structure (2) is terminated by connectors each linked to at least one two-wire line (50, 52), the matching means (46, 48) comprise a plurality of adapters of each two-wire line, disposed on either side of the tested structure (2), each comprising a voltage splitting circuit (54) and a two-wire connection terminal (58, 60) formed by the two central conductors of two coaxial cables (60) whose outer conductors are short-circuited.

4. The device for electromagnetic characterization as claimed in claim 1, furthermore comprising means of transmission (8, 14, 12, 18) of the pulsed signal (26) alone, to the means of analysis (6) for the provision of a reference signal for them.

5. The device for electromagnetic characterization as claimed in claim 1, wherein the width of the predetermined frequency band is greater than or equal to 1 GHz.

6. The device for electromagnetic characterization as claimed in claim 1, wherein the pulsed signal (26) is the pulsed signal of Gaussian general shape.

7. The device for electromagnetic characterization as claimed in claim 1, wherein the means of analysis (6) comprise a first path (20, 34, 38) for processing the signal emitted by the generator (4) and the signal reflected by the tested structure (2), comprising at least one reception path (20), and a second path (24, 42, 44) for processing the signal transmitted by the tested structure (2) comprising at least one reception path (24).

8. The device for electromagnetic characterization as claimed in claim 7, wherein the temporal filtering means (32) comprise first means (38) of selection between predetermined instants of a part of the signals received by the first processing path (20, 34, 38), this part containing only the signal reflected by the tested structure (2), and second means (42) of selection between predetermined instants of a part of the signals received by the second processing path (24, 42, 44), this part containing only the signal transmitted by the tested structure (2).

9. The device for electromagnetic characterization as claimed in claim 8, wherein means (44) of prolongation by continuity of said part containing only the signal transmitted by the tested structure (2), for the reconstruction of this transmitted signal, are associated with said second means of selection (42).

10. The device for electromagnetic characterization as claimed in claim 1, wherein the tested structure (2) is a connector of multiwire links.

11. The device for electromagnetic characterization as claimed in claim 1, wherein the means of calculation (41) comprise means (41b) of calculation of the amount of power radiated by the tested structure (2).

12. The device for electromagnetic characterization as claimed in claim 11, wherein the tested structure (2) is a connector of multiwire links, and
- the means of calculation (41) comprise means (41c) of calculation of the field radiated by this connector (2), when the latter is used in the implementation of a link between an emitter (76) and a receiver (78) of electrical signals.

13. A process for electromagnetic characterization of a tested structure (2) terminated by connectors linked to transmission lines of any impedance, by evaluating, on a predetermined frequency band, distribution parameters of this structure (2) and characteristic parameters of the spurious radiations of this structure (2), the process comprising the following steps:
- the emission, at least once, by a generator (4) of an electrical signal toward the tested structure (2);
- the reception of the signal emitted by the generator (4) as well as of the signals reflected by the structure (2) and of the signals transmitted by the structure (2), by means of analysis (6); and
- the calculation by the means of analysis (6) of the distribution parameters of the tested structure (2) and of the characteristic parameters of the spurious radiations of this structure (2), wherein the electrical signal is a pulsed signal (26) of greater spectral width than said predetermined frequency band, and in that the process furthermore comprises a step of temporal filtering of the signals received by the means of analysis (6), for the elimination of spurious signals (64, 74).

* * * * *